United States Patent [19]
Ajisawa et al.

[11] Patent Number: 5,825,047
[45] Date of Patent: Oct. 20, 1998

[54] OPTICAL SEMICONDUCTOR DEVICE

[75] Inventors: Akira Ajisawa; Tomoji Terakado; Masayuki Yamaguchi; Keiro Komatsu, all of Tokyo, Japan

[73] Assignee: NEC Corporation, Tokyo, Japan

[21] Appl. No.: 307,036

[22] Filed: Sep. 16, 1994

Related U.S. Application Data

[63] Continuation of Ser. No. 983,276, Nov. 30, 1992, abandoned, which is a continuation of Ser. No. 634,891, Dec. 27, 1990, abandoned.

[30] Foreign Application Priority Data

Dec. 27, 1989 [JP] Japan ..................................... 1-340101
Mar. 13, 1990 [JP] Japan ..................................... 2-62981

[51] Int. Cl.⁶ .......................... H01L 21/20; H01L 21/205
[52] U.S. Cl. ................................. 257/12; 372/26; 372/50
[58] Field of Search .............................. 350/96.14, 96.13; 372/50, 26; 357/16, 17, 19, 12, 13, 21

[56] References Cited

U.S. PATENT DOCUMENTS 4,608,696 8/1986 Law et al. ................................. 372/50
4,820,655 4/1989 Noda et al. ................................ 372/50

OTHER PUBLICATIONS

S.C. Lin et al, "Efficient, Low Parasitics 1.3 μm InGaAsP . . . on Semi–Insulating Substrate", IEEE Photonics Technology Letters, vol. 1, No. 9, Sep. 1989, pp. 270–272.

H. Soda et al, "High–power semi–insulating BH structure . . . light source operating at 10 Gb/s", Conference Papeer, IOOC '89 Technical Digest, 20PDB–5, vol. 5, No. 5, Jul., 1989.

Wakita et al, Preliminary Lecture Paper C–474, Institute of Electronics Informations and Communications Engineers, Spring National Conference 1989.

*Primary Examiner*—Donald Monin
*Attorney, Agent, or Firm*—Sughrue, Mion, Zinn, Macpeak & Seas, PLLC

[57] ABSTRACT

An optical semiconductor device comprises a stripe-mesa structure provided on a semi-insulating substrate. The stripe-mesa structure comprises an undoped light absorption layer sandwiched by cladding layers, and by burying layers on both sides. With this structure, the device capacitance is decreased to provide wide bandwidth and ultra-high speed operation properties. This device can be applied to an optical modulator, an integrated type optical modulator, and an optical detector.

46 Claims, 14 Drawing Sheets

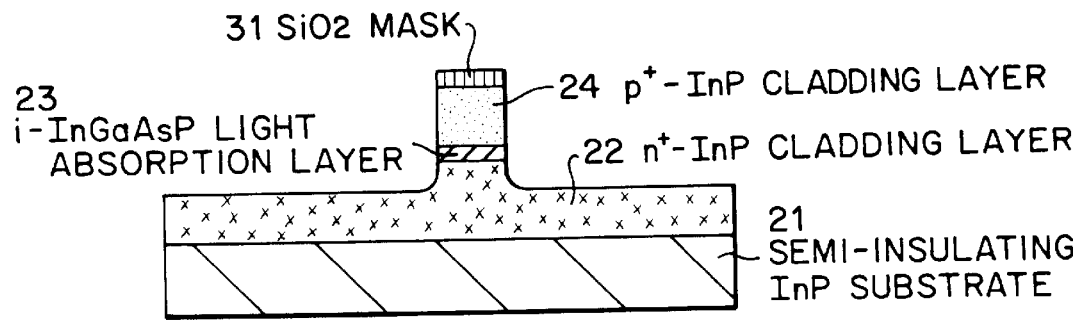
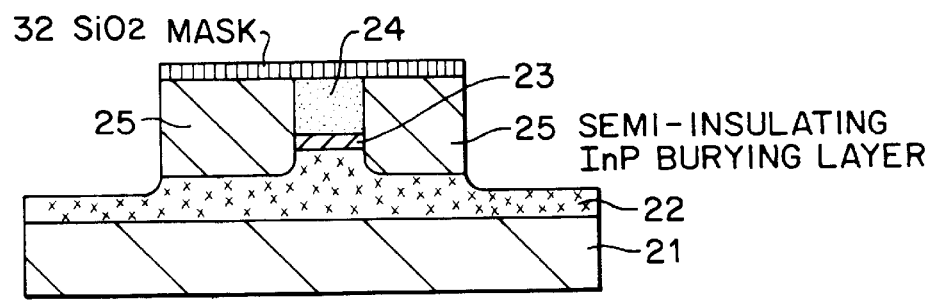
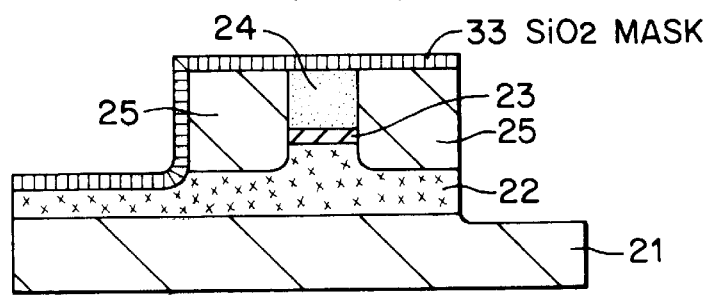
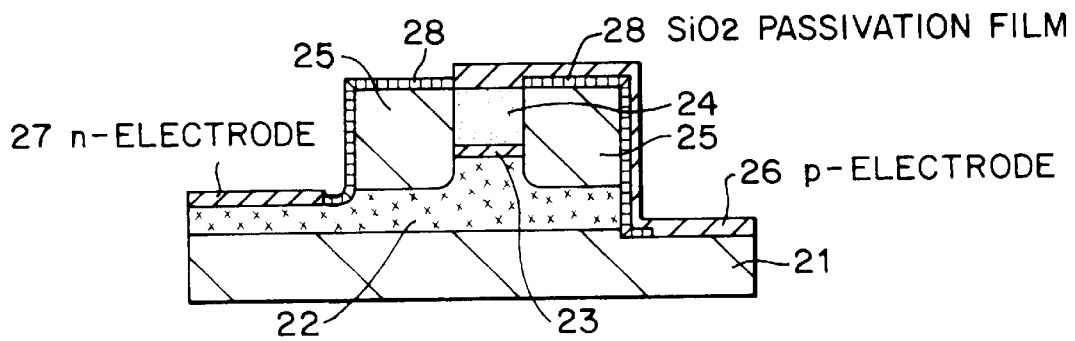

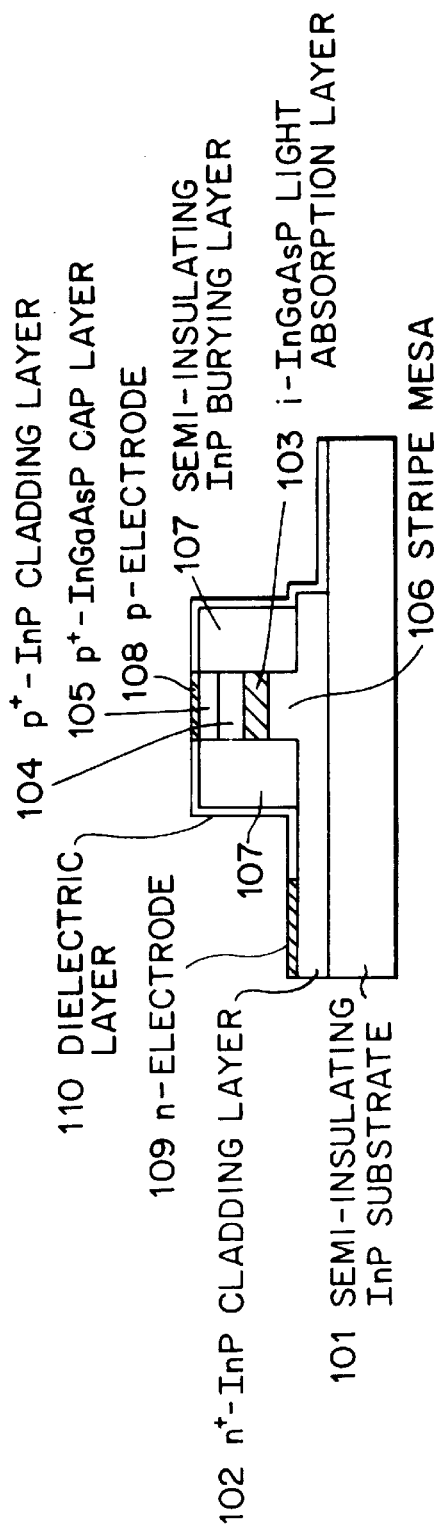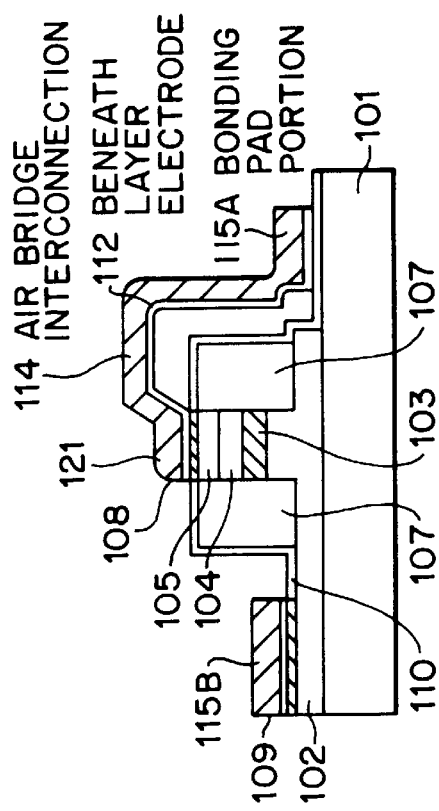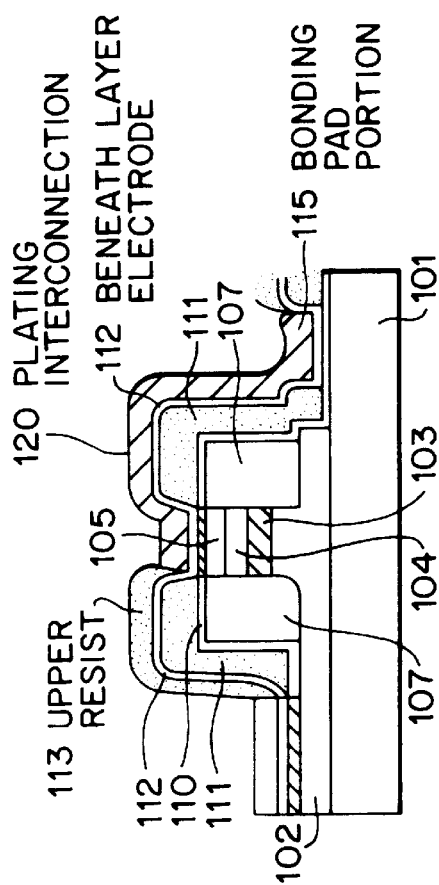

OPTICAL SEMICONDUCTOR DEVICE

This is a Continuation of application Ser. No. 07/983,276 filed Nov. 30, 1992, now abandoned which is a Continuation of application Ser. No. 07/634,891 filed Dec. 27, 1990, now abandoned.

FIELD OF THE INVENTION

This invention relates to an optical semiconductor device, and more particularly to an optical semiconductor device applicable to an optical modulator, an integrated type optical modulator, an optical detector, etc.

BACKGROUND OF THE INVENTION

In accordance with the development of optical communication systems in recent years, optical modulators which operate at an ultra-high speed and by a low voltage, and are small in size and easily integrated with other devices, optical detectors which operate at a high speed, etc. are greatly sought after for various practical uses. In optical semiconductor modulators, an optical modulator which utilizes an effect of increasing light absorption loss in an optical waveguide by applying a voltage to the optical waveguide (Franz-Keldysh effect or Quantum confined Stark effect) has advantages in that, if a device capacitance is decreased, it operates with a several tens GHz modulation bandwidth, and it can be integrated with a DFB laser, etc. For instance, a 20 GHz optical modulator using an InGaAlAs/InAlAs multiple quantum well structure is described in "a preliminary lecture paper C-474 of the spring national conference, 1989 in the Institute of Electronics Informations and Communications Engineers" by Wakita et al. This modulator is an absorption type modulator utilizing the shift of an absorption peak induced by an electric field generated by a reverse bias voltage applied to a semiconductor PIN structure, and comprises an n-InAlAs cladding layer, a multiple quantum well layer and a p-InAlAs cladding layer successively grown on an n-InP substrate by MBE method. A modulation frequency band Δf of this modulator is a function of a device capacitance C, and is defined by the following equation.

$$\Delta f = 1/\pi CR$$

The device capacitance C is expressed by a sum of a junction capacitance Cj of a pn junction in the stripe-optical waveguide, an interconnection capacitance Ci of an interconnection connecting a stripe-electrode to a bonding pad, and a pad capacitance Cp at the bonding pad.

In this modulator, the device capacitance is as low as 0.2 pF to provide an ultra-high speed modulation, because it has a low capacitance structure having a polyimide burying layer under the bonding pad. Even in this structure, however, the junction capacitance Cj which is inherent to a modulator is less than a half of the whole device capacitance C. The remaining capacitance is due to the interconnection and pad capacitances Ci and Cp, which are unnecessary for the device, and is produced among the n-InP substrate, the interconnection, and the electrode. Considering the switching characteristics of this modulator, a large decrease of the junction capacitance Cj is difficult, because this modulator has a device length of approximately 100 μm. In addition, achieving a decrease in the interconnection and pad capacitances Ci and Cp is also difficult, because a conductive substrate such as the n-InP substrate is used.

For this reason, a conventional optical modulator has a modulation band of 20 to 25 GHz at most, so that it can not be applied to an ultra-high speed optical modulator having a modulation band of more than 50 GHz.

Another conventional optical modulator is described in "IOOC '89, Technical Digest 20PDB-5, 1989" by Soda et al. This optical modulator is integrated with a DFB laser on an n-InP substrate, and is a modulator utilizing light absorption of Franz-Keldysh effect and having burying layers of semi-insulating InP on the both sides of an optical waveguide for the modulator and the DFB laser. Even in this integrated modulator, a polyimide layer is provided under an electrode pad to decrease a large parasitic capacitance, the large capacitance being generated due to the use of the conductive substrate. As a result, a device capacitance of approximately 0.55 pF and a modulation band of approximately 10 GHz are achieved.

As described above, a limitation occurs in decreasing device capacitance because a conductive substrate is used. A limitation also occurs in expanding modulation frequency bandwidth, explained above to be approximately 25 GHz in the former modulator and approximately 10 GHz in the latter integrated type modulator. Because the thickness of the semi-insulating layer between the electrode provided on the conductive substrate and the other electrode provided on the stripe-mesa portion and the semi-insulating layer is only 2 to 3 μm on both sides of the stripe-mesa portion, it is difficult to decrease the device capacitance to less than 0.5 pF. Although the device capacitance can be decreased by increasing the thickness, another limitation occurs in fabricating the devices due to the increase in mesa height.

In order to overcome these disadvantages, an absorption type optical modulator using a semi-insulating InP substrate is proposed on pages 270 to 272 of "IEEE PHOTONICS TECHNOLOGY LETTERS, Vol 1, No.9, September 1989" by Lin et al. This optical modulator comprises a lower undoped InP cladding layer, an undoped InGaAsP absorption layer, an upper undoped InP cladding layer, a p-InP cladding layer, and a p-InGaAsP cap layer successively provided on the semi-insulating InP substrate, and has a ridge type optical waveguide formed by removing portions of the p-InGaAsP cap layer, the p-InP cladding layer, and the upper undoped InP cladding layer by etching. The optical modulator further comprises a p-electrode provided on the p-InGaAsP cap layer, and an n-electrode provided on the undoped InGaAsP absorption layer.

In this optical modulator, the resistance of the n-side semiconductor layers is large, and the serial resistance of this device is large, although the device capacitance is as low as 10 fF when an electric field is applied to this device. In this case, a disadvantage occurs in that high speed operation is difficult to achieve due to the large resistance, in spite of the small device capacitance.

Furthermore, if the undoped layers were to be transformed into n-layers in this optical modulator, the serial resistance and the expansion of the depletion layer would be deviated in run-to-run operation. Thus, the reproducibility of the modulation frequency bandwidth and the operation voltage is lowered, resulting in low practicability.

SUMMARY OF THE INVENTION

Accordingly, it is an object of this invention to provide an optical semiconductor device such as an optical modulator, an integrated type optical modulator, the optical detector, etc. by reducing an interconnection capacitance and the bonding pad capacitance.

It is a further object of this invention to provide an optical semiconductor device such as an optical modulator, an integrated type optical modulator, an optical detector, etc. having a wide bandwidth property and high practicability.

According to this invention, an optical semiconductor device, comprises: a stripe-mesa structure provided on a semi-insulating semiconductor substrate, the stripe-mesa structure including at least a first conduction type cladding layer, an undoped light absorption layer, a second conduction type cladding layer, and a second conduction type cap layer; semi-insulating burying layers provided on both sides of the stripe-mesa structure; and means for applying a predetermined electric field to the undoped light absorption layer.

In this invention, a semi-insulating semiconductor substrate is used, and an optical waveguide of a PIN structure is buried on its both sides with semi-insulating layers, such that the capacitance of portions having no connection with the operation of the optical semiconductor device is decreased as much as possible, thereby decreasing the total capacitance of the device. This provides an optical semiconductor device having a property of a wide bandwidth.

In general, the capacitance C is expressed by the following equation.

$$C = \epsilon_s \epsilon_o S/d$$

where $\epsilon_s$ is the specific inductivity, $\epsilon_o$ is the dielectric constant of a vacuum, S is an area of each electrode (or a p-n junction area), and d is the distance between electrodes (or a depletion thickness). As described in conjunction with the conventional optical modulator, above, the total capacitance Ct of a device is expressed by the following equation.

$$Ct = Cj + Ci + Cp$$

where Cj is the junction capacitance, Ci is the interconnection capacitance, and Cp is the bonding pad capacitance. The junction capacitance Cj has an effect on the static characteristic of an optical modulator. Therefore, the optical modulator is designed to provide no deterioration of the static characteristic, such that the optical waveguide width is 2 $\mu$m, the optical waveguide length is 100 $\mu$m, and the depletion layer thickness is 0.3 $\mu$m. Thus, a junction capacitance Cj of approximately 74 fF is obtained. The interconnection and pad capacitances Ci and Cp should preferably be decreased for a wide bandwidth property of the optical modulator.

In this invention, the distance a between the electrodes is chosen as long as approximately 100 $\mu$m, so that the interconnection and pad capacitances Ci and Cp are decreased to be one-tenth of those in the conventional optical modulator that uses a conductive substrate and a dielectric burying layer such as polyimide, etc. only under the bonding pad (d is 2 to 3 $\mu$m and $\epsilon_s$ is equal to or nearly 3), and one-thirtieth of those in the conventional optical modulator that uses a semi-insulating burying layer of a semiconductor only under a bonding pad (d is 2 to 3 $\mu$m, and $\epsilon_s$ is equal to or nearly 12). Consequently, the total capacitance Ct of the device is determined almost entirely by the junction capacitance Cj, so that an optical semiconductor device having a wide bandwidth property is obtained.

An optical waveguide of a PIN structure provided on a semi-insulating substrate and buried with semi-insulating layers is similar in structure to a semiconductor laser. Therefore, an optical modulator according to the invention is easily integrated with a semiconductor laser to provide an integrated type optical modulator operating at an ultra-high speed.

A structure of an optical modulator according to the invention can be used as a waveguide type optical detector, if a light absorption layer is composed of a material having a bandgap wavelength which is longer than a wavelength of a light source, and photocurrent induced by light absorbed in the light absorption layer is detected by p-and n-electrodes.

BRIEF DESCRIPTION OF THE DRAWINGS

This invention will be explained in more detail in conjunction with the appended drawings, wherein:

FIGS. 4A to 4D are schematic cross-sectional views showing steps of fabricating the optical modulator in the second preferred embodiment;

FIGS. 12A to 12C are schematic cross-sectional views showing steps of fabricating the optical modulator in the fourth preferred embodiment.

DESCRIPTION OF THE PREFERRED EMBODIMENTS

Figure 1:
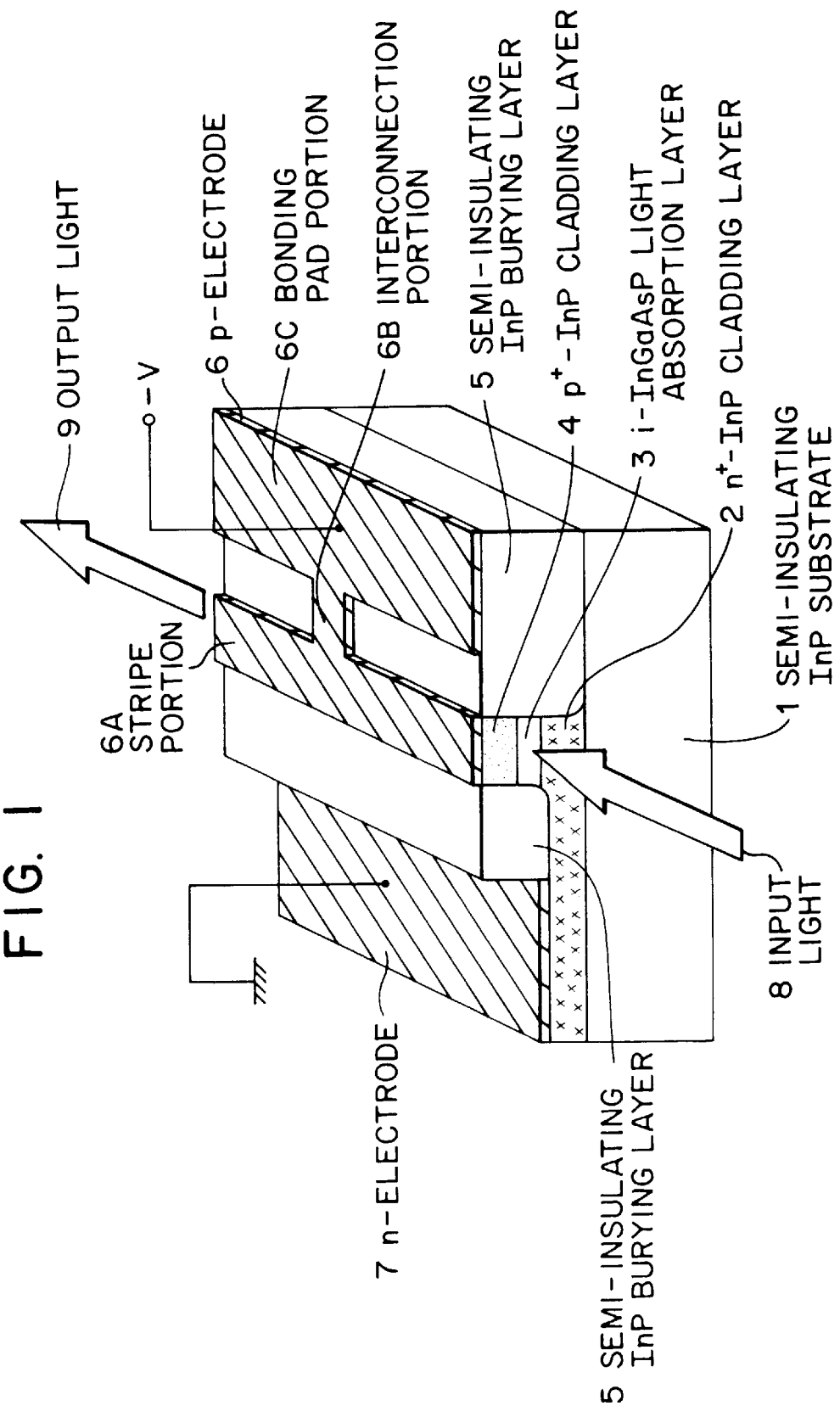
FIG. 1 is a schematic view of an optical modulator in a first preferred embodiment according to the invention.

FIG. 1 shows an optical modulator in the first preferred embodiment according to the invention. The optical modulator comprises a semi-insulating InP substrate 1, an n$^+$-InP cladding layer 2, an i-InGaAs light absorption layer 3, a p$^+$-InP cladding layer 4, semi-insulating InP burying layers 5, a p-electrode 6, and an n-electrode 7. The p-electrode 6 has a stripe portion 6A, an interconnection portion 6B, and a bonding pad portion 6C.

In this optical modulator, an incident light 8 is modulated to be supplied as an output light 9 dependent on a light absorption coefficient which changes based on an electric field generated by a voltage $-V$ applied across the p- and n-electrodes 6 and 7.

In the optical modulator of the first preferred embodiment, though an optical waveguide of a double-hetero structure using an InGaAsP/InP system material is explained, the material and the structure may be replaced by an InGaAs/InAlAs system material, a GaAs/AlGaAs system material, etc. and by a multiple quantum well structure, etc.

The fabrication steps of the optical modulator will be explained in FIGS. 2A to 2E.

Figure 2A:
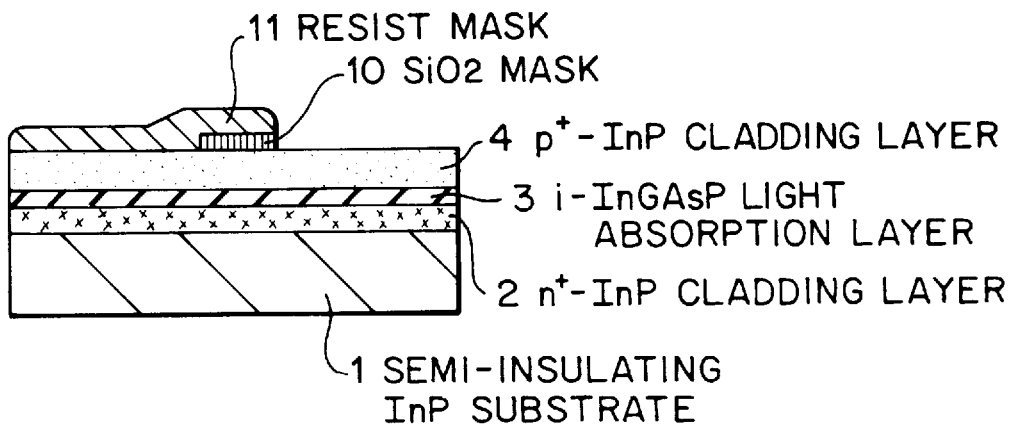
FIGS. 2A to 2E are schematic cross-sectional views showing steps of fabricating the optical modulator in the first preferred embodiment.

An n$^+$-InP cladding layer 2 having a thickness of 0.5 $\mu$m, an i-InGaAsP light absorption layer 3 having a bandgap wavelength of 1.475 $\mu$m and a thickness of 0.3 $\mu$m, and a p$^+$-Inp cladding layer 4 having a thickness of 1.2 $\mu$m are successively grown on a semi-insulating InP substrate 1 by MOVPE method. Then, a stripe-mask 10 of SiO$_2$ having a stripe-width of 2 $\mu$m is formed on the p$^+$-Inp cladding layer 4 to provide an optical waveguide by ordinary photolithography method, and a resist mask 11 is provided on the stripe-mask 10 and on one side of the p⁺-InP cladding layer 4 relative to the strip-mask 10, as shown in FIG. 2A.

Figure 2B:
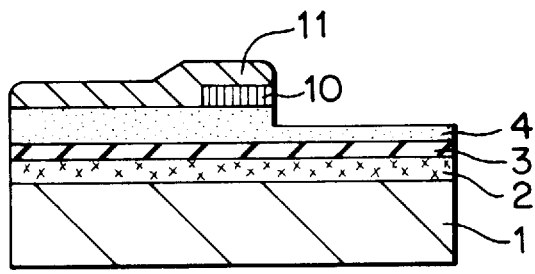

The p⁺-InP cladding layer 4 is removed on the other side having no resist mask to provide a thinned p⁺-InP cladding layer 4 having a thickness of 0.5 μm by etching, as shown in FIG. 2B.

Figure 2C:
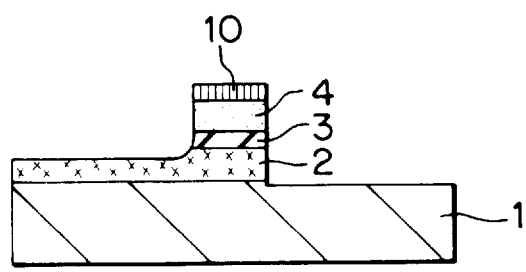

The resist mask 11 is removed, and etching is carried out to provide a three-dimensional optical waveguide by use of the SiO₂ stripe-mask 10. At this time, a depth of the etching is controlled to be approximately 1.6 μm, so that the n-InP cladding layer 2 is exposed on one side of the stripe-mask 10, and the semi-insulating InP substrate 1 is exposed on the other side of the stripe-mask 10, as shown in FIG. 2C.

Figure 2D:
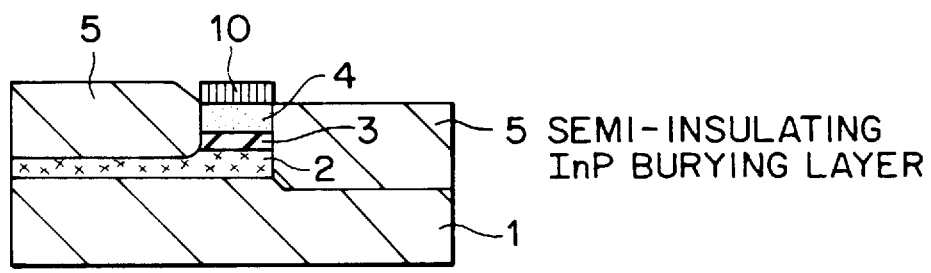

The SiO₂ stripe-mask 10 is used for a selective epitaxial mask to bury the stripe-mesa portion with Fe-doped semi-insulating InP burying layers 5 on both sides of the stripe-mesa portion, as shown in FIG. 2D.

Figure 2E:
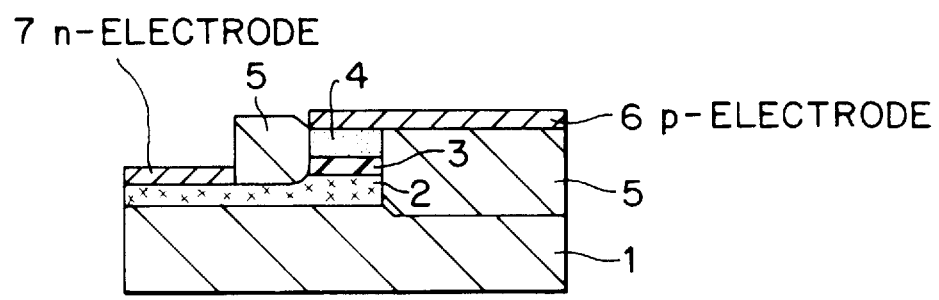

The SiO₂ stripe-mask 10 is removed, and a p-electrode 6 is provided on the semi-insulating InP burying layer 5 which is directly in contact with the semi-insulating InP substrate 1. Finally, the semi-insulating InP burying layer 5 which is in contact with the n⁺-InP cladding layer 2 is etched to expose the n⁺-InP buffer layer 2, and an n-electrode 7 is provided on the exposed n⁺-InP cladding layer 2, as shown in FIG. 2E.

In the optical modulator thus fabricated, a distance between the p- and n-electrodes 6 and 7 is approximately 100 μm, the substrate 1 is polished to be approximately 100 μm in thickness, and a device length is made to be 100 μm by cleaved facets. The p-electrode 6 has an area of 100 μm×2 μm on the stripe-mesa portion, an area of 10 μm×20 μm on the interconnection portion, and an area of 100 μm×100 μm on the bonding pad portion, such that the capacitance is decreased due to the decrease in total area based on the separation of the above three portions.

In operation, a static characteristic of the optical modulator will be first explained. Here, it is assumed that a wavelength of the incident light 8 is 1.55 μm used for optical communication. When no reverse bias voltage is applied across the p- and n-electrodes 6 and 7, the incident light 8 supplied to the optical modulator is emitted therefrom as the output light 9 without any modulation. In this case, a loss of light transmitted through the optical modulator is as low as approximately 1.5 dB in accordance with the parameters that the device length is 100 μm, and a wavelength detuning between the incident light 8 and a bandgap of the optical waveguide layer is 75 μm. When an electric field is applied to the i-InGaAsP light absorption layer 3 by applying a reverse bias voltage −V across the p- and n- electrodes 6 and 7, no output light 9 is obtained, because the light is absorbed in the i-InGaAsP light absorption layer 3 by Franz-Keldysh effect. In this case, a satisfactory result in which a light extinction ratio is more than 10 dB is obtained, when the reverse bias voltage is −3V.

Next, a modulation characteristic will be explained. As described before, the modulation frequency bandwidth Δf is determined by the following equation.

$$\Delta f = 1/\pi CR$$

In this preferred embodiment, if it is assumed that the specific inductivity of the semiconductor is 12.5, the junction capacitance Cj is 74 fF, and the interconnection and pad capacitances Ci and Cp, together, are 12 fF. Thus, the total device capacitance is 86 fF. As a result, the device capacitance determining the modulation speed becomes one-fifth to one-tenth of that of the conventional optical modulator. Consequently, a modulation frequency bandwidth Δf of 74 GHz is obtained to provide an optical modulation having an ultra high speed modulation property.

Figure 3:
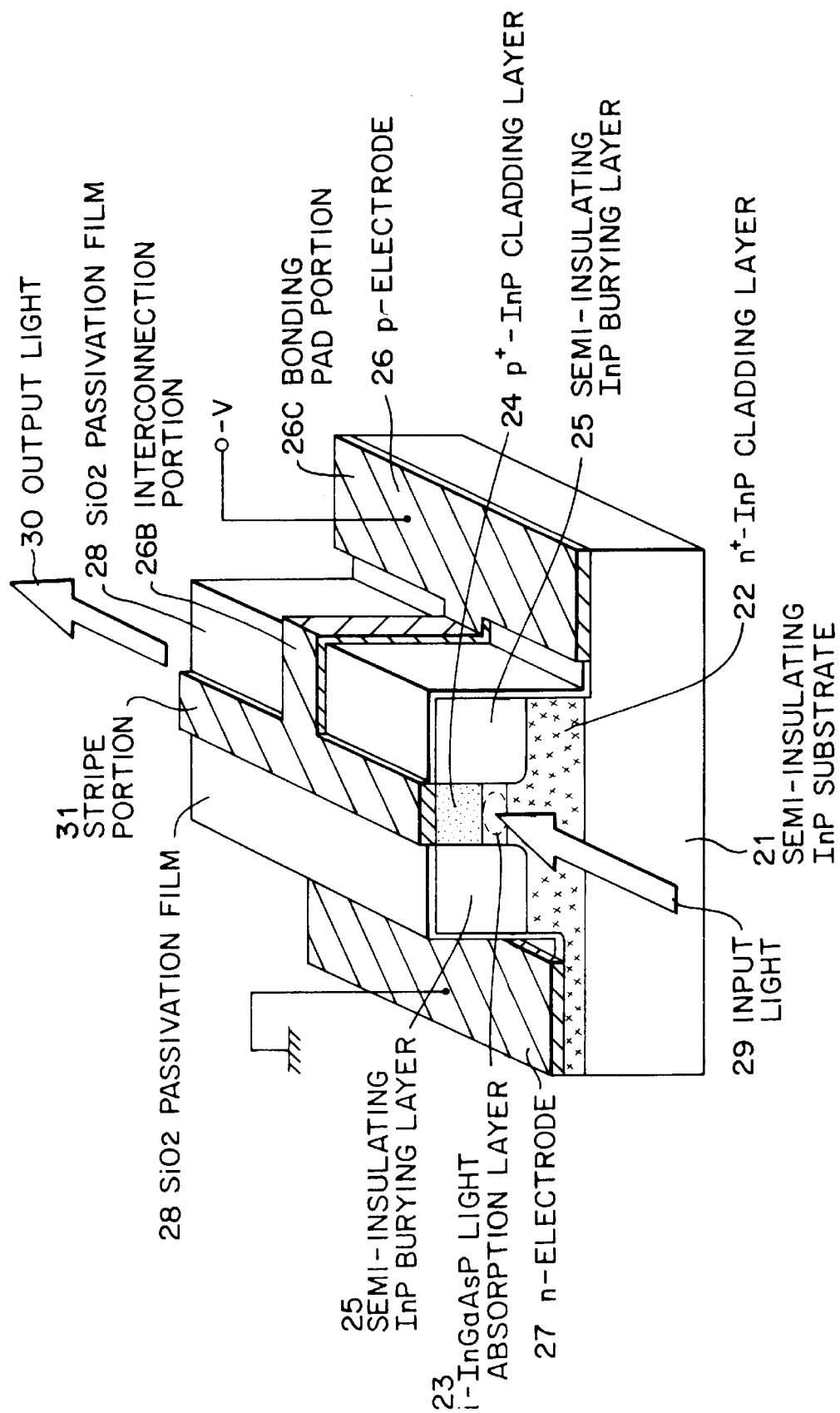
FIG. 3 is a schematic view of an optical modulator in a second preferred embodiment according to the invention.

FIG. 3 shows an optical modulator in the second preferred embodiment according to the invention. The fabrication steps of this optical modulator will be explained in FIGS. 4A to 4D.

An n⁺-InP cladding layer 22 having a thickness of 1.0 μm, an i-InGaAsP light absorption layer 23 having a bandgap wavelength of 1.475 μm and a thickness of 0.3 μm, and a p⁺-InP cladding layer 24 having a thickness of 1.2 μm are successively grown on a semi-insulating InP substrate 21 by MOVPE method, and a stripe-mask 31 of SiO₂ having a width of 2 μm is formed on the p⁺-InP cladding layer 24 to provide an optical waveguide by ordinary photolithography method. Then, a three-dimensional optical waveguide is provided by etching using the SiO₂ stripe-mask 31, as shown in FIG. 4A. At this time, the depth of the etching is approximately 1.8 μm, so that the n⁺-InP cladding layer 22 is exposed.

The stripe-mesa structure is buried on both sides with semi-insulating InP burying layers 25 using the SiO₂ stripe-mask 31. Then, the SiO₂ is removed, and a stripe-mask 32 of SiO₂ having a width of 20 μm is provided to cover the stripe-mesa. The semi-insulating InP burying layers 25 and a small upper skin portion of the exposed n⁺-InP cladding layer 22 are etched to provide a relatively wide stripe-mesa structure by use of the SiO₂ stripe-mask 32, as shown in FIG. 4B.

A mask 33 of SiO₂ including the SiO₂ mask 32 is provided on the relatively wide stripe-mesa structure and on the n⁺-InP cladding layer 22, such that one side of the cladding layer 22 is covered with the mask 33, and the other side thereof is exposed. Then, the other side of the cladding layer 22 is etched by use of the SiO₂ mask 33, as shown in FIG. 4C.

The SiO₂ mask 33 is removed, and a p-electrode 26 is provided on the exposed p⁺-InP cladding layer 24 of the stripe-mesa structure, and on the semi-insulating burying layer 25 and the semi-insulating InP substrate 21 of the side having no n⁺-InP cladding layer 22 via a passivation film 28 of SiO₂. Finally, an n-electrode 27 is provided on the n⁺-InP cladding layer 22 which is on the side opposite to the p-electrode 26, as shown in FIG. 4D. The p-electrode 26 has a stripe-portion 26A, an interconnection portion 26B, and a bonding-pad portion 26c, as shown in FIG. 3.

In the optical modulator thus fabricated, the semi-insulating InP substrate 21 is polished to be approximately 100 μm in thickness, and a device length is made to be 100 μm by cleaved facets. The p-electrode 26 has an area of 100 μm×2 μm on the stripe-mesa portion, an area of 10 μm×20 μm on the interconnection portion, and an area of 100 μm×100 μm on the pad portion.

In operation of the optical modulator in the second preferred embodiment, the same static characteristic as in the first preferred embodiment is obtained, because the composition and the layer thickness of the i-InGaAsP light absorption layer 23 are the same as those in the first preferred embodiment. That is, a transmission loss between an incident light 29 having a wavelength of 1.55 μm and an output light 30 is as low as approximately 1.5 dB, and a light extinction ratio is more than 10 dB, when a reverse bias voltage of −3V is applied across the p- and n-electrodes 26 and 27.

On the other hand, a modulation frequency bandwidth Δf of 69 GHz which is a little narrower than the value in the first preferred embodiment is obtained, because the device capacitance is increased by a small amount to be 92 fF, as compared to the value in the first preferred embodiment, due to the structure difference of the interconnection and the pad portions of the p-electrode 26. This difference can be compensated by changing the polishing thickness of the substrate and/or the area of an electrode bonding pad portion. Consequently, an ultra-high speed optical modulator having a modulation frequency band of more than 50 GHz is easily obtained even in the second preferred embodiment.

In the optical modulators of the first and second preferred embodiments, a device length, an optical waveguide width, an electrode bonding pad portion area, etc. may be changed. An n-side cladding layer may be composed of an InP layer and an InGaAsP layer, one layer of which is used for an etching-stop layer, and an InGaAsP cap layer may be provided on a p-side InP cladding layer. Further, the semi-insulating InP burying layers provided on both sides of the stripe-mesa structure may be replaced, to provide the same advantage for an optical modulator, by dielectric material layers such as polyimide, etc.

Figure 5A:
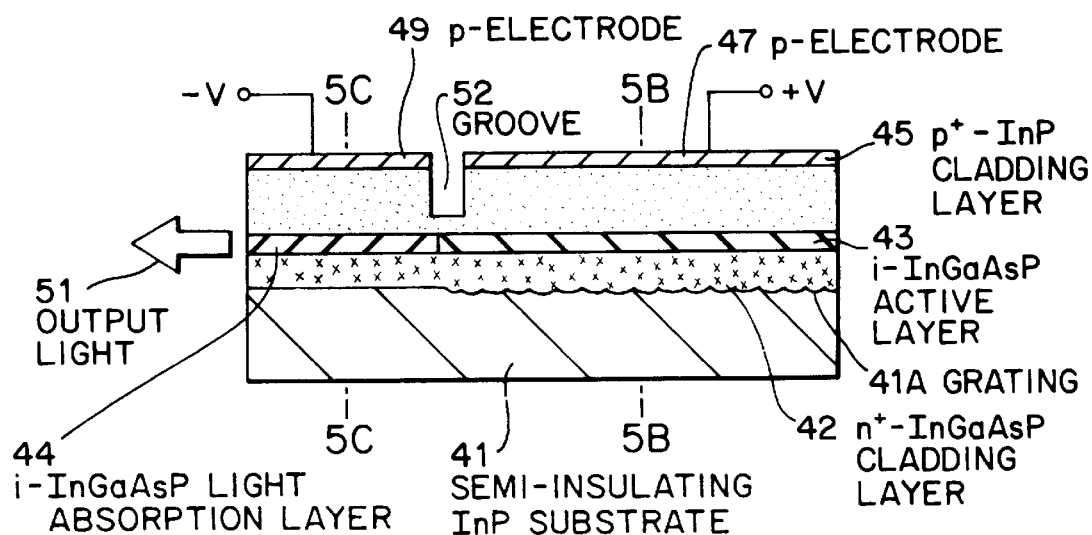
FIGS. 5A to 5C are schematic cross-sectional views showing an integrated type optical modulator in a first preferred embodiment according to the invention.
Figure 5B:
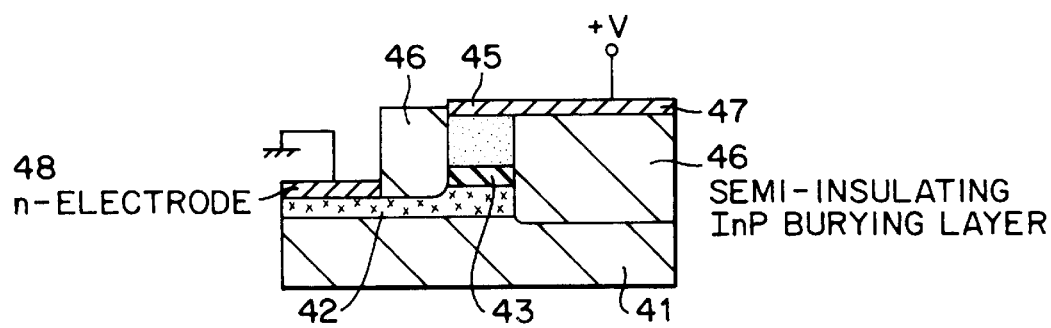
Figure 5C:
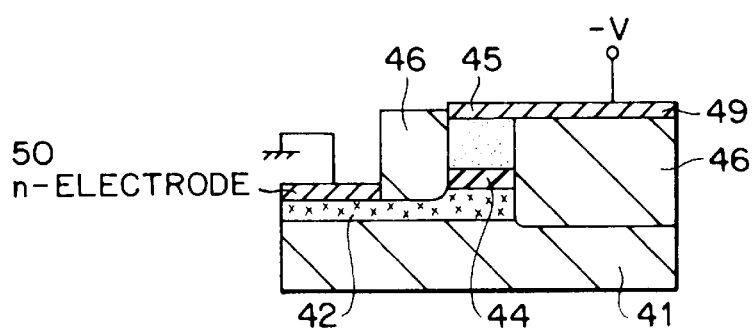

FIGS. 5A to 5C show an integrated type optical modulator in a first preferred embodiment according to the invention, wherein FIG. 5A is a cross-sectional view along a direction of light transmission, and FIGS. 5B and 5C are cross-sectional views along lines B—B and C—C in FIG. 5A, respectively.

First, the fabrication steps of this integrated type optical modulator will be briefly explained.

An $n^+$-InGaAsP cladding layer 42 having a bandgap wavelength of 1.2 μm and a thickness of 0.5 μm, and an i-InGaAsP active layer having a bandgap wavelength of 1.55 m and a thickness of 0.3 μm are grown on a semi-insulating InP substrate 41, having a grating 41 A at a region of a semiconductor laser, by MOVPE method, and the i-InGaAsP active layer 42 is left only on the grating to expose the $n^+$-InGaAsP cladding layer 42 on the region of the optical modulator having no grating by etching using a $SiO_2$ mask (not shown). Then, an i-InGaAsP light absorption layer 44 having a bandgap wavelength of 1.475 μm and a thickness of 0.3 μm is selectively grown on the exposed $n^+$-InGaAsP cladding layer 42. As a result, an optical cascaded connection is obtained between the i-InGaAsP active layer 43 and the i-InGaAsP light absorption layer 44. Then, the $SiO_2$ mask is removed, and a $p^+$-InP cladding layer 45 having a thickness of 1.3 μm is grown on the cascaded connection layer. The steps as explained in FIGS. 2A to 2D are applied to the fabrication process after the above steps in this preferred embodiment. That is, a stripe-mesa structure is formed by two etching steps, such that the semi-insulating InP substrate 41 is exposed on one side of the stripe-mesa structure, and the $n^+$-InGaAsP cladding layer 42 is exposed on the other side of the stripe-mesa structure. Then, the stripe-mesa structure is buried on both sides with semi-insulating InP burying layers 46, and a groove 52 having a depth of 1 μm and a length of 10 μm is provided to provide an electric separation between the optical modulator and the semiconductor laser. Finally, p-and n-electrodes 47 and 48 for the semiconductor laser, and p- and n-electrodes 49 and 50 for the optical modulator are independently provided, respectively. The substrate 41 is polished to be approximately 100 μm in thickness, and the length of the device is made to be 400 μm including 300 μm for the semiconductor laser and 100 μm for the optical modulator. The p-electrode 49 has an area of 100 μm×2 μm for the stripe-mesa portion, an area of 10 μm×20 μm for the interconnection portion, and an area of 100 μm×100 μm for the pad portion.

In operation, when a forward bias is applied to a laser diode, the stimulated emission occurs, so that an output light 51 is supplied through the light absorption layer 44 which is cascade-connected to the active layer 43. The threshold current of the laser diode is 50 mA, the lasing wavelength is 1.55 μm, and the power of the output light 51 is 5 mW, when the current is 100 mA. When a reverse bias voltage −V is applied across the p-and n-electrodes 49 and 50, the light which is propagated through the light absorption layer 44 is absorbed by the Franz-Keldysh effect to provide light modulation. Operation of the optical modulator has been already explained with respect to FIG. 1. Therefore, it is not repeated here. Even in this integrated type optical modulator, a modulation frequency bandwidth of more than 50 GHz is obtained to provide an ultra-high speed modulation. Materials, structure and fabrication method of this integrated type optical modulator may be changed. For instance, an anti-reflection film and a high reflection film are provided on an output face and a reflection face, respectively, to provide a high output device.

The optical modulators as shown in FIGS. 1 and 3 may be used as an optical detector. In such an application, the i-InGaAsP light absorption layer is designed to include a composition having a bandgap of, for instance, 1.67 μm, which is larger than the wavelength of the light source, so that photocurrent induced by light which is absorbed in the light absorption layer is detected by the p- and n-electrodes to realize a waveguide type optical detector. The structure and fabrication process of this optical detector are the same as those explained in FIGS. 1 to 4. In this case, the device capacitance is decreased to be as low as 90 fF. Consequently, an optical detector having an ultra-wide bandwidth property is obtained.

Figure 6:
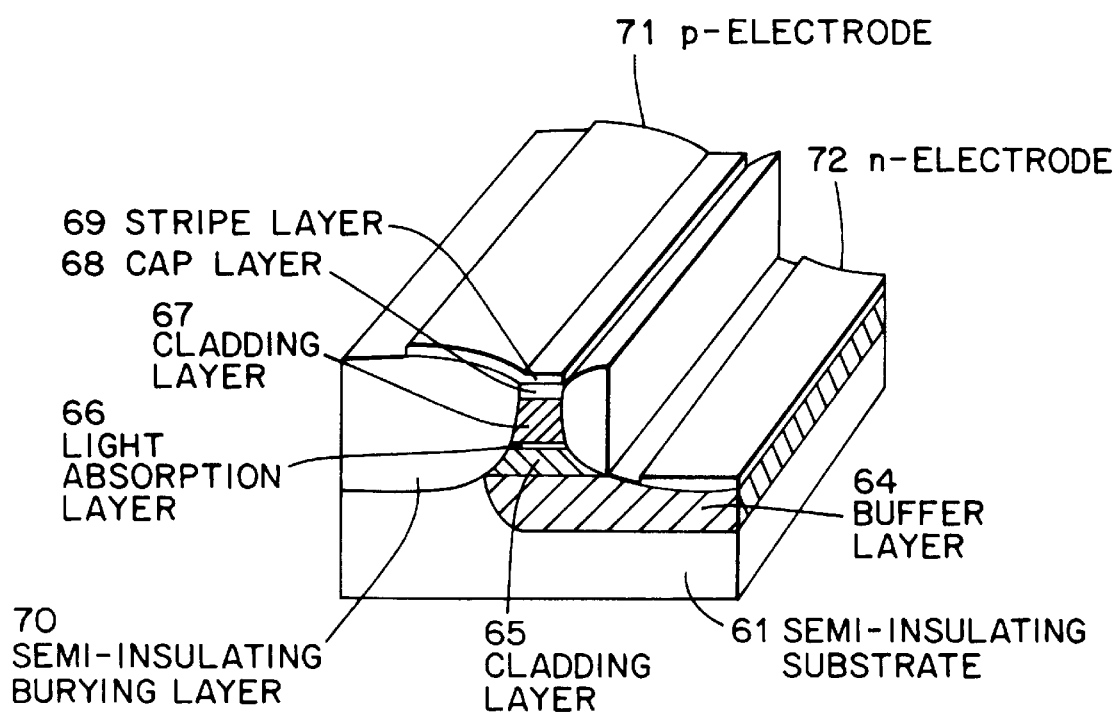
FIG. 6 is a schematic view showing an optical modulator in a third preferred embodiment according to the invention.

FIG. 6 shows an optical modulator in the third preferred embodiment according to the invention. This optical modulator is fabricated as shown in FIGS. 7A to 7D, and comprises a semi-insulating InP substrate 61, an n-InGaAsP buffer layer 64 having a composition corresponding to a bandgap wavelength of a 1.1 μm and a thickness of 3 μm included partially in the upper portion of the substrate 61, a stripe-mesa structure 69 having a width of 1.5 μm and including an n-InP lower cladding layer 65 having a thickness of 0.5 μm, an undoped InGaAsP light absorption layer 66 having a thickness of 0.3 μm and a composition of 1.4 μm wavelength, a p-InP upper cladding layer 67 having a thickness of 1.5 μm and a $p^+$-InGaAs cap layer 68 having a thickness of 0.5 μm, Fe-doped semi-insulating InP burying layers 70 provided on both sides of the mesa structure 69 thereby buried, a p-electrode 71 provided on the semi-insulating layer 70 and on the mesa structure 69, and an n-electrode 72 provided on the exposed portion of the buffer layer 64. Anti-reflection films are provided on both faces corresponding to light input and output planes to suppress light reflection thereon, and the device length is 300 μm.

This optical modulator is fabricated as shown in FIGS. 7A to 7D.

Figure 7A:
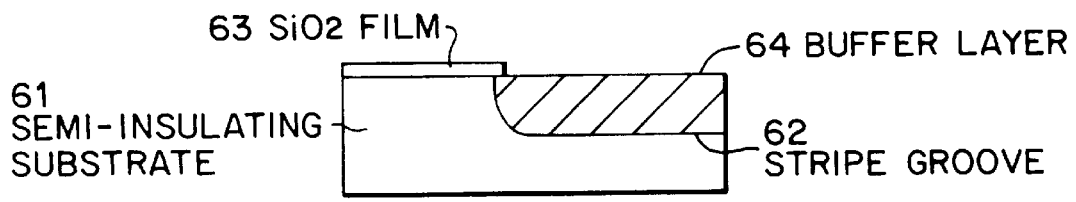
FIGS. 7A to 7D are schematic cross-sectional views showing steps of fabricating the optical modulator in the third preferred embodiment.

In FIG. 7A, a stripe-groove 62 having a depth of 3 μm is formed on a semi-insulating InP substrate 61 by chemical etching using an etching mask 63 of $SiO_2$, and the groove 62 is buried to be flat relative to the substrate 61 with an n-InGaAsP buffer layer 64 selectively fabricated by hydride VPE method.

Figure 7B:
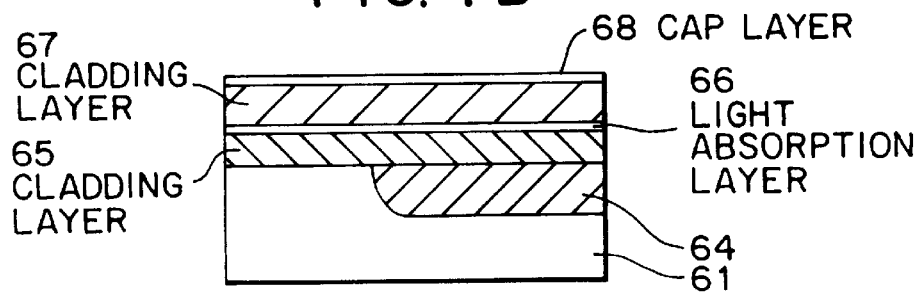

In FIG. 7B, the etching mask 63 is removed, and an n-InP lower cladding layer 65, an undoped i-InGaAsP light absorption layer 66, a p-InP upper cladding layer 67, and a $p^+$-InGaAs cap layer 68 are grown on the substrate 61 buried with the buffer layer 64 by MO-VPE method.

Figure 7C:
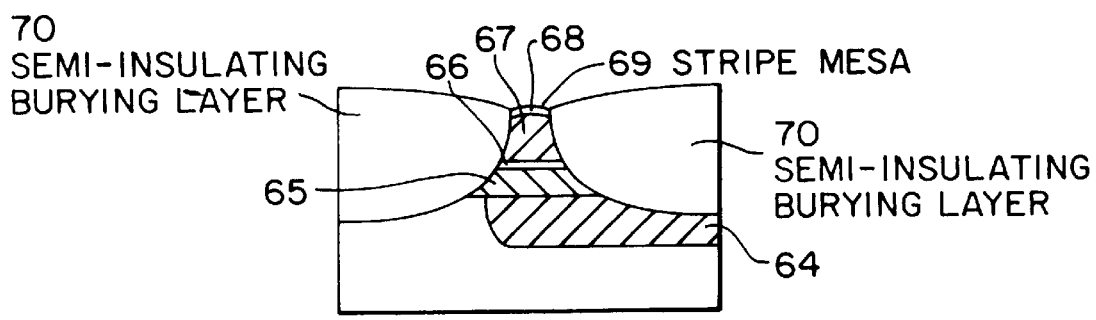

In FIG. 7C, a stripe-mesa structure 69 is formed to be positioned over the edge of the stripe-buffer layer 64 by photolithography and etching, such that a width of the stripe-mesa structure 69 is 1.5 μm, and the high-resistance substrate 61 is exposed on one side, while the buffer layer 64 is exposed on the other side. Then, the stripe-mesa structure 69 is buried on both sides with Fe-doped semi-insulating InP burying layers 70.

Figure 7D:
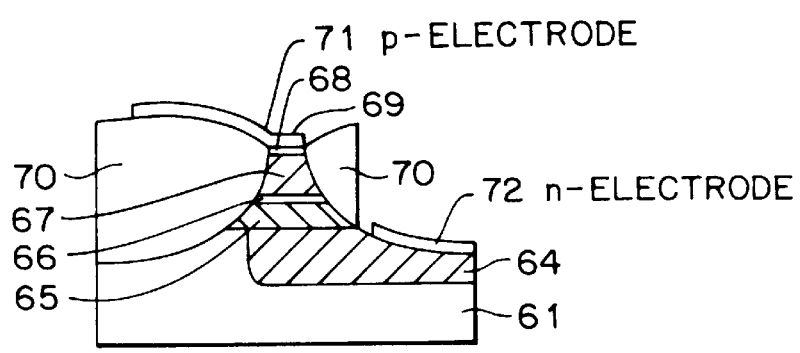

In FIG. 7D, a portion of the semi-insulating layer 70 which is positioned on the buffer layer 64 is removed by use of etchant of, for instance, HCl for etching only InP selectively. Then, a p-electrode 71 of Ti/Pt/Au is provided on the cap layer 68 and on the semi-insulating burying layer 70 by sputtiring method, and an n-electrode 72 of AuGeNi is provided on the exposed portion of the buffer layer 64 by thermal VDE method. Finally, anti-reflection films of SiNx are provided on both cleaved faces of the device by sputtering method.

The optical modulator thus fabricated has a device capacitance of 0.25 pF, and a modulation frequency bandwidth of 26 GHz is obtained, when an incident light having a wavelength of 1.55 μm is supplied to the device. These performances reflect a twofold improvement over the conventional optical modulator.

In this preferred embodiment, InGaAsP may be replaced in the buffer layer 64 by n-InP. In the above described fabrication method, the semi-insulating substrate 61 and the buffer layer 64 are exposed on both sides of the stripe-mesa structure 69 by only one mesa etching step, and photolithography is easily carried out at the time of the mesa etching. As a result, yield and uniformity are improved twofold over the conventional optical modulator.

FIGS. 8A and 8B, 9A and 9B, and 10A and 10B show methods for providing a semi-insulating substance having a flat surface and a stripe-buffer layer of a first conduction type provided partially in the upper portion of the substrate.

Figure 8A:
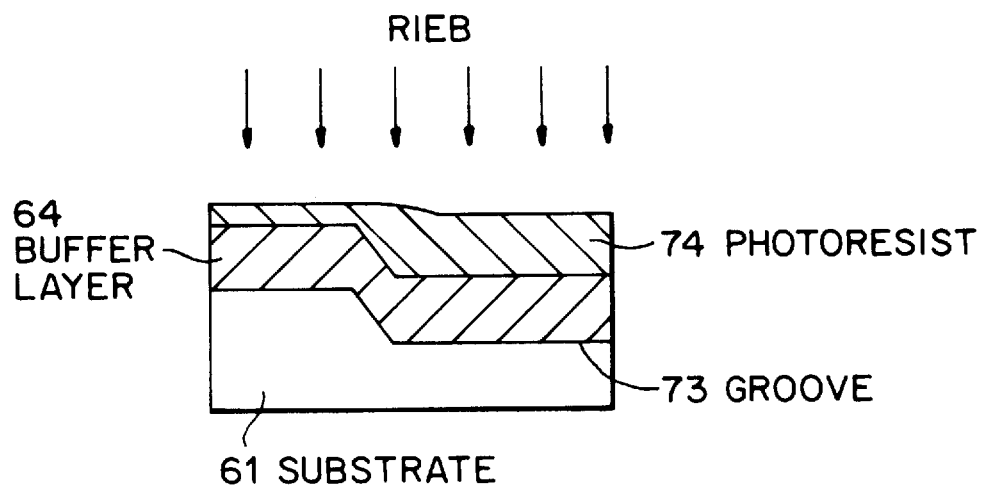
FIGS. 8A and 8B, 9A and 9B, and 10A and 10B are schematic cross-sectional views showing steps of fabricating semi-insulating substrates having buffer layers of a first conduction type.

In FIG. 8A, a groove 73 having a depth of 3 μm is formed on a semi-insulating substrate 61 which is then covered over its entire surface by a buffer layer 64 of n-InGaAsP having a thickness of approximately 3 μm. Thereafter, a photoresist 74 (for instance, AZ-series of Hexist Inc.) is applied on the n-InGaAsP buffer layer 64 to provide a substantially flat surface by spin-coating.

Figure 8B:
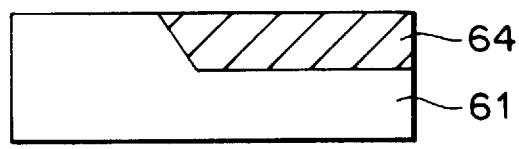

In FIG. 8B, the photoresist 74 and the buffer layer 64 are etched at a uniform velocity by RIBE (reactive ion beam etching). This uniform velocity etching is realized by adjusting a mixing ratio of mixture gas consisting of Ar, $O_2$ and HCl which is used as reactive gas for the etching. When the semi-insulating substrate 61 is exposed at a region except for the groove 73, the etching is finished. If residual photoresist exists on the buffer layer 64, the photoresist is removed. The substrate thus obtained is easy to be controlled in following fabrication steps to provide better yield and interlayer-uniformity, because the degree of flatness of the surface is high.

Figure 9A:
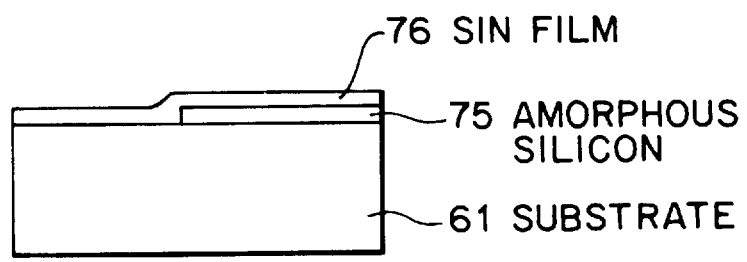

In FIG. 9A, an amorphous Si layer 75 is formed partially on a semi-inslating substrate 61. The semi-insulating substrate 61 having the amorphous Si layer 75 is then covered by a SiN film 76.

Figure 9B:
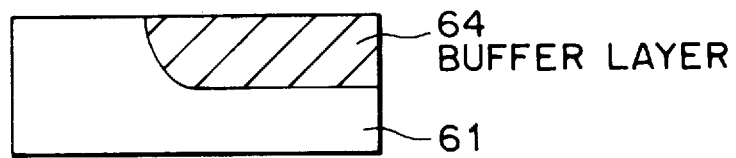

In FIG. 9B, a thermal treatment is carried out at a temperature of approximately 800° C. to diffuse Si into the substrate 61. Then, the SiN film 76 and the amorphous Si layer 75 are removed. The surface of the substrate thus obtained is completely flat, so that the formation of a stripe-mesa structure becomes much easier. Further, the fabrication of a diffraction grating necessary for the integration with a DFB laser, etc. becomes easy. In the above embodiment, the n-buffer layer 64 may be replaced by a p-buffer layer. For the p-buffer layer, impurities such as Zn, Cd, etc. are diffused into the semi-insulating substrate. In this case, the conduction types of the other semiconductor layers must necessarily be reversed.

Figure 10A:
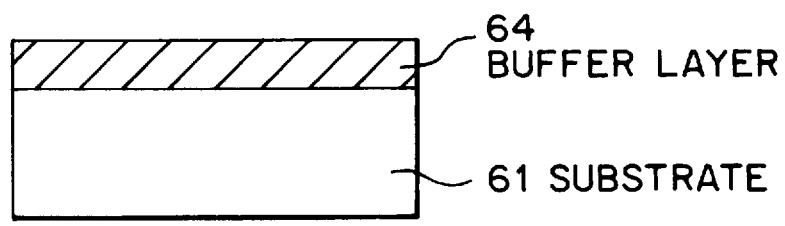

In FIG. 10A, an n-InP buffer layer 64 having a thickness of approximately 3 μm is provided on the entire surface of a semi-insulating substrate 61.

Figure 10B:
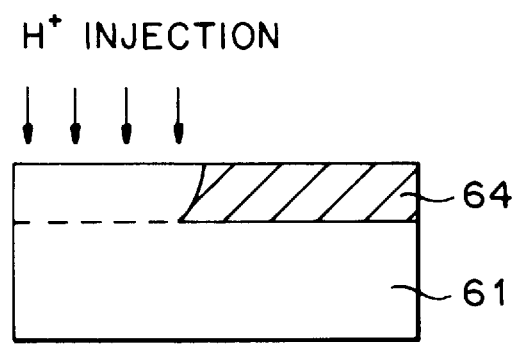

In FIG. 10B, ions such as $H^+$, $B^+$, etc. for increasing a resistance of a semiconductor are injected at a region having no need for the provision of a buffer layer into the semi-insulating substrate 61 by a depth of more than the thickness of the buffer layer 64. As a result, the n-buffer layer 64 is partially formed in the upper portion of the substrate 61. The thickness of the buffer layer 64 can be larger than those obtained in FIGS. 8B and 9B, because ions such as $H^+$ and $B^+$ are injected deeper than $Si^+$. This provides great freedom in designing the buffer layer.

Figure 11:
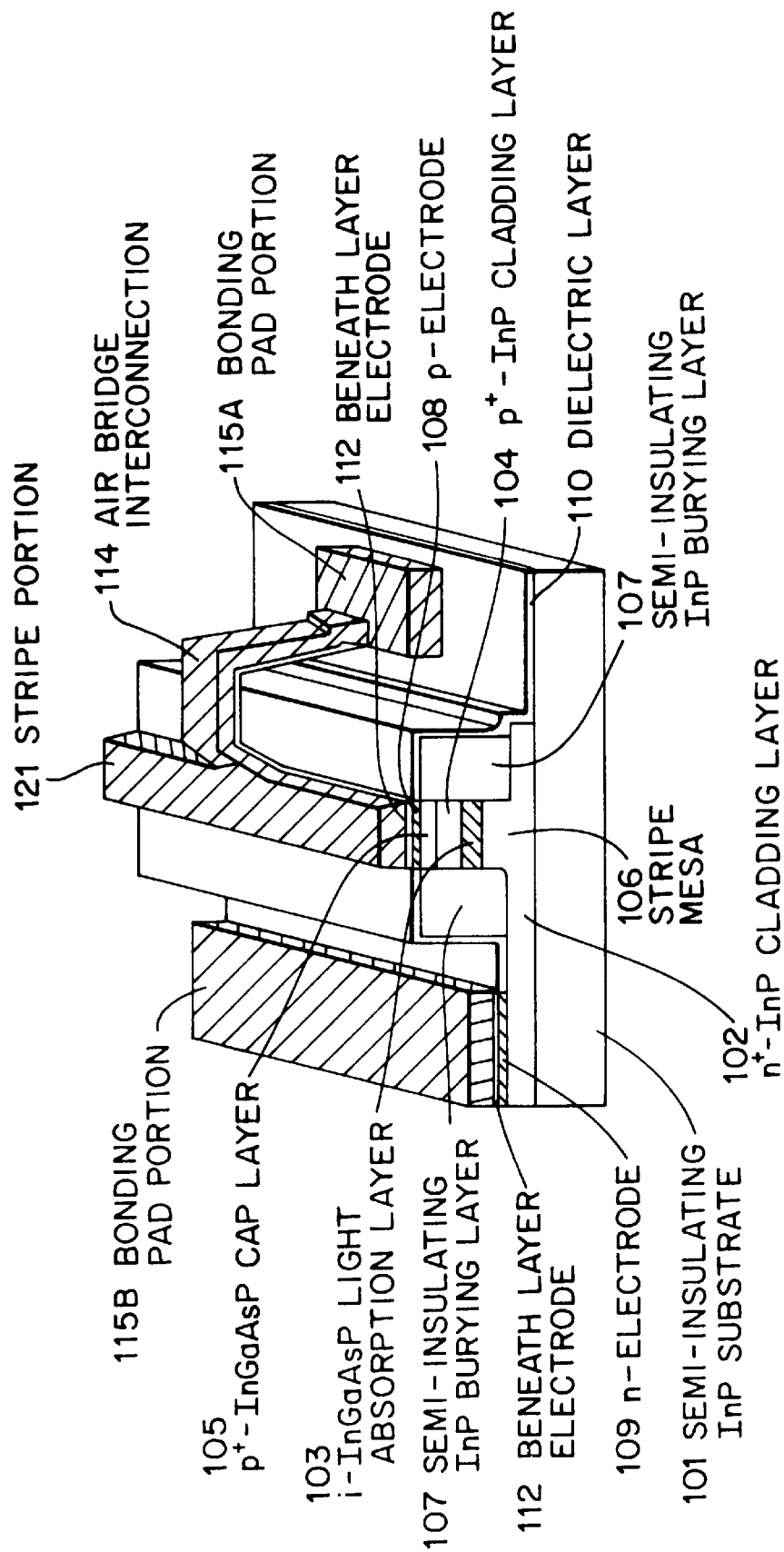
FIG. 11 is a schematic view showing an optical modulator in a fourth preferred embodiment according to the invention.

FIG. 11 shows an optical modulator in the fourth preferred embodiment according to the invention, and FIGS. 12A to 12C show the fabrication method of the optical modulator.

The optical modulator comprises a semi-insulating InP substrate 101, a stripe-mesa structure 106 including an $n^+$-InP cladding layer 102, an i-InGaAsP light absorption layer 103, a p-InP cladding layer 104, and a $p^+$-InGaAs cap layer 105, semi-insulating InP burying layers 107 provided on both sides of the stripe-mesa structure 106, a p-electrode 108, an n-electrode 109, a dielectric layer 110, and a beneath layer electrode 112. The p-electrode 108 has a stripe-portion 121, an interconnection portion 114 of an air-bridge structure, and a bonding pad 115A, and the n-electrode 109 has a bonding pad 115B.

In fabricating this optical modulator, an $n^+$-InP cladding layer 102 having a thickness of 2.0 μm and a carrier concentration of $5 \times 10^{17}$ $cm^{-3}$, an undoped InGaAsP light absorption layer 103 having a thickness of 0.3 μm and a bandgap wavelength of 1.475 μm, a $p^+$-InP cladding layer 104 having a thickness of 2.0 μm and a carrier concentration of $5 \times 10^{17}$ $cm^{-3}$ and a $p^+$-InGaAs cap layer 105 having a thickness of 0.3 μm and a carrier concentration of $1 \times 10^{19}$ $cm^{-3}$ are grown successively on a Fe-doped semi-insulating InP substrate 101 by organic metal vapour phase epitaxy (MOVPE) method. Next, a stripe-$SiO_2$ mask having a width of 2 μm is provided on the cap layer 105 by ordinary photolithography method, and a stripe-mesa structure 106 is formed to expose the cladding layer 102 by etching using the stripe-$SiO_2$ mask. Then, this stripe-$SiO_2$ mask is used for selectively burying the stripe-mesa structure on both sides with Fe-doped semi-insulating InP burying layers 107. Thereafter, a stripe-mesa structure having a width of 10 μm including the stripe-mesa structure 106 and the burying layers 107 is formed to expose the cladding layer 102 on one side and the high-resistance InP substrate 101 on the other side by selective etching using an ordinary photolithography method. Next, a p-electrode 108 of AuZn is provided on the cap layer 105, and an n-electrode 109 of AuGeNi is provided on the cladding layer 102, respectively, as shown in FIG. 12A.

A lower resist 111 having a thickness of 2 μm is patterned to provide an air-gap for the air-bridge interconnection structure, and a beneath layer electrode 112 of Ti/Au having respective thicknesses 500 Å/500 Å, on which an Au-plating electrode is provided, is provided by vapor deposition in vacuum. Then, an upper resist 113 which is patterned on the beneath layer electrode 112 is used for a mask, so that a selective Au-plating layer 120 is provided, as shown in FIG. 12B.

The upper resist 113 is removed by $O_2$ plasma, and a predetermined portion of the beneath layer electrode 112 is removed. Thus, the lower resist 111 is removed to provide an interconnection part 114 for the air-bridge structure and a bonding pad 115, as shown in 12C. Then, the semi-insulating InP substrate 101 is polished to be approximately 100 μm in thickness, and the length of the device is made to be 100 μm by cleaving the faces. The p-electrode has an area of 100 μm×2 μm at the stripe-portion 121, and an area of 50 μm×50 μm at the pad portion 115, and the interconnection portion 114 has a width of 10 μm, a length of 50 μm, and a height of 2 μm at the air-bridge structure.

In operation of this optical modulator, a static characteristic will be first discussed. Here, it is assumed that a wavelength of an incident light is 1.55 μm used for optical communication. When no reverse bias voltage is applied across the p- and n-electrodes 108 and 109, the incident light is transmitted through the device as an output light without any modulation. In this case, a transmission loss is as low as approximately 1.5 dB, because a wavelength detuning between the incident light and the bandgap of the light absorption layer is 75 μm.

When a reverse bias voltage is applied across the p-and n-electrodes 108 and 109 to apply an electric field to the i-InGaAsP light absorption layer 103, an incident light is absorbed in the i-InGaAsP light absorption layer 103 during the transmission through the device by Franz-Keldysh effect, so that no output light is supplied therefrom. In this case, a light extinction ratio is more than 10 dB, which is a satisfactory property with a voltage of −3V.

Next, a modulation characteristic will be explained. As described before, a frequency bandwidth Δf of an optical modulator using a field effect is determined by a device capacitance C, as defined below.

$$\Delta f = 1/(\pi CR)$$

In this preferred embodiment, if a calculation is carried out on the assumption that the specific dielectric coefficient of the semiconductor is 12.5, the junction capacitance $C_j$ is 74 fF, and the interconnection capacitance $C_i$ and a pad capacitance $C_p$ are 3 fF combined. Thus, the total capacitance of this device, determining the modulation speed, is 77 fF, which is one fifth to one ninth the value of the conventional optical modulator. A modulation frequency bandwidth of 83 GHz is obtained to provide an optical modulator having an ultra-high speed modulation property.

Figure 13:
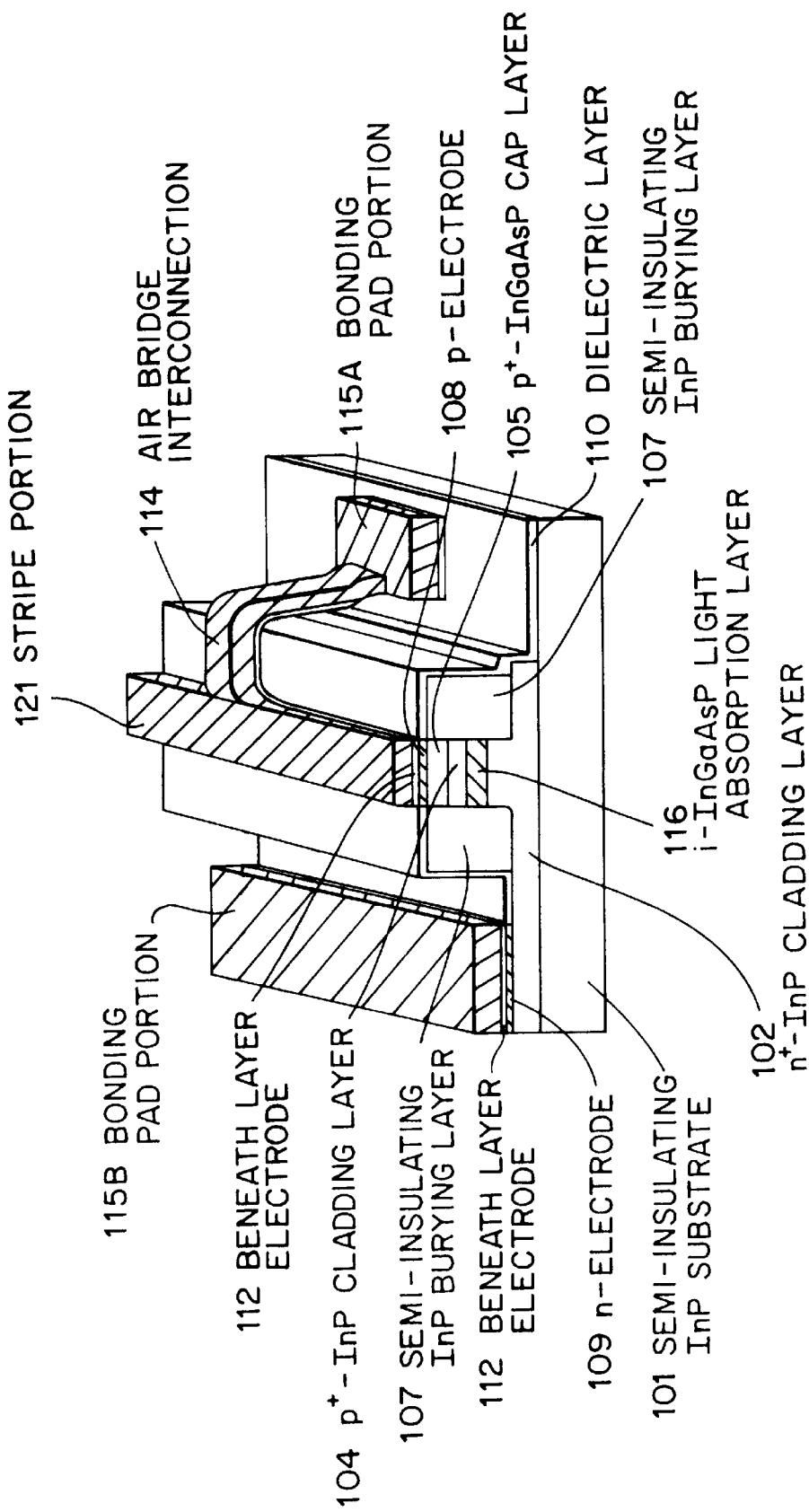
FIG. 13 is a schematic view showing an optical detector in a first preferred embodiment according to the invention.

FIG. 13 shows an optical detector in a preferred embodiment according to the invention. Parts of this optical detector are indicated by like reference numerals as those used in FIG. 11. The only difference therebetween is that the light absoprtion layer 116 is composed of InGaAs having a lattice matching property relative to InP. The same fabrication method as shown in FIGS. 12A to 12C is adopted to fabricate this optical detector.

In this optical detector, when a wavelength of an incident light is 1.55 μm, the incident light is effectively absorbed in the light absorption layer 116 of InGaAs, because a bandgap wavelength of the light absorption layer 116 is 1.67 μm, which is on a wavelength side longer than that of the incident light. Photocurrent induced by absorbed light is detected by the p-and n-electrodes 108 and 109. Thus, this device functions as a waveguide type optical detector. In this case, if a device length and a thickness of the InGaAs light absorption layer 116 are the same as those in the aforementioned first preferred embodiment, a device capacitance can be less than 0.1 pF to provide an optical detector having an ultra-wide bandwidth property.

In the preferred embodiments, n-and p-layers may be replaced by opposite conduction type layers, respectively. The light absorption layer may be replaced by a multi-quantum well structure. Materials are not limited to InGaAsP/InP, since materials such as InGaAs/InAlAs, AlGaAs/GaAs, AlGaInP/GaInP/GaAs, etc., which are used in ordinary semiconductor lasers and semiconductor herero-junction detectors, may be used. The Fe-doped semi-insulating InP layer may be replaced by a semi-insulating semiconductor layer doped with dopant such as Co, Ti, etc., or by a semi-insulating dielectric material such as polyimide. Although it is considered that stress is applied to the semiconductor layer, because the thermal expansion coefficient of polyimide is different from that of the semiconductor, a predetermined reliability is obtained in accordance with the decrease of stress by decreasing the volume of polyimide as a result of narrowing the width of the groove. Polyimide is effectively used in an optical modulator and an optical detector, although a semiconductor is preferably used in a semiconductor laser, which generally produces heat.

Although the invention has been described with respect to specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An optical semiconductor device, comprising:
   a stripe-mesa structure provided on a semi-insulating substrate, said stripe-mesa structure including a first cladding layer of a first conduction type, an undoped light absorption layer, a second cladding layer of a second conduction type, and a cap layer of said second conduction type;
   semi-insulating burying layers for burying said stripe-mesa structure on both sides thereof; and
   means for detecting photocurrent generated by light absorbed into said undoped light absorption layer, wherein
   (a) said detecting means includes no more than two electrodes, a first one of said electrodes being connected to said cap layer, and the second one of said electrodes being connected to said first cladding layer exposed on said semi-insulating substrate,
   (b) said first electrode includes a stripe-portion positioned on said cap layer, a bonding pad portion provided exclusively on one of the sides of said stripe-mesa structure, and an interconnection portion connecting said stripe-portion to said bonding pad portion, and
   (c) said second electrode is provided exclusively on the other of the sides of said stripe-mesa structure;
   whereby said optical semiconductor device has a response bandwidth of greater than 26 GHz.

2. An optical semiconductor device, according to claim 1, wherein:
   said undoped light absorption layer is composed of a composition having a bandgap wavelength which is longer than a wavelength of light supplied thereto.

3. An optical semiconductor device, according to claim 1, wherein:
   said bonding pad portion is positioned on one of said semi-insulating burying layers.

4. An optical semiconductor device, according to claim 1, wherein:

said bonding pad portion is positioned on said semi-insulating substrate.

5. An optical semiconductor device, according to claim 4, wherein:

said interconnection portion crosses one of said semi-insulating burying layers to have air-space relative to said one of said semi-insulating burying layers.

6. An optical semiconductor device according to claim 1, wherein said optical semiconductor device has a response bandwidth of greater than 50 GHz.

7. An optical semiconductor device, comprising:

a buffer layer formed in an exposed upper portion of said semi-insulating substrate;

a stripe-mesa structure provided over said semi-insulating substrate, said stripe-mesa structure including a first cladding layer of a first conduction type, an undoped light absorption layer, a second cladding layer of a second conduction type, and a cap layer of said second conduction type;

semi-insulating burying layers for burying said stripe-mesa structure on both sides thereof; and means for applying an electric field to said undoped light absorption layer; wherein (a) said applying means includes no more than two electrodes, a first one of said electrodes being connected to said cap layer, and the second one of said electrodes being connected to said buffer layer exposed on said semi-insulating substrate;

(b) said first electrode has a first portion provided on said stripe-mesa structure and a second portion provided exclusively on one of the sides of said stripe-mesa structure, and (c) said second electrode is provided exclusively on the other of the sides of said stripe-mesa structure;

whereby said optical semiconductor device has a modulation bandwidth of greater than 26 GHz.

8. An optical semiconductor device, according to claim 7, wherein:

said undoped light absorption layer is composed of a composition having a bandgap wavelength which is longer than a wavelength of light supplied thereto.

9. An optical semiconductor device according to claim 7, wherein said optical semiconductor device has a modulation bandwidth of greater than 50 GHz.

10. An optical semiconductor device comprising:

(a) an optical modulator, including:

a stripe-mesa structure provided on a semi-insulating substrate, said stripe-mesa structure including a first cladding layer of a first conduction type, an undoped light absorption layer, a second cladding layer of a second conduction type, and a cap layer of said second conduction type;

semi-insulating burying layers for burying said stripe-mesa structure on both sides thereof; and first means for applying an electric field to said undoped light absorption layer;

whereby said optical modulator has a modulation bandwidth greater than 26 GHz; and (b) a semiconductor laser, including:

a stripe-mesa structure provided on a portion having a grating of said semi-insulating substrate, said stripe-mesa structure including a first cladding layer of said first conduction type, an undoped active layer, a second cladding layer of said second conduction type, and a cap layer of said second conduction type;

semi-insulating burying layers for burying said stripe-mesa structure on both sides thereof; and second means for applying an electric field to said active layer;

wherein said undoped light absorption layer and said undoped active layer are connected by an optical coupling, said first and second applying means each includes no more than two electrodes, one of said electrodes being an electric-separated electrode and the other of said electrodes being a common electrode, and said second cladding layers are divided by a groove having a predetermined depth, and wherein said electric-separated electrodes have first portions provided on said stripe-mesa structures and second portions provided exclusively on one of the sides of said stripe-mesa structures, and said common electrode is provided exclusively on the other side of said stripe-mesa structures.

11. An optical semiconductor device according to claim 10, wherein said optical modulator has a modulation bandwidth of greater than 50 GHz.

12. An optical semiconductor device comprising:

a stripe-mesa structure including a first cladding layer of a first conduction type, an undoped light absorption layer, a second cladding layer of a second conduction type, and a cap layer of said second conduction type;

semi-insulating burying layers for burying said stripmesa structure on both sides thereof; and means for applying an electric field to said undoped light absorption layer;

wherein said applying means include no more than two electrodes, a first one of said electrodes being connected to said cap layer, and the second one of said electrodes being connected to said first cladding layer;

said first electrode includes a stripe-portion positioned on said cap layer, a bonding pad portion provided exclusively on one of the sides of said stripe-mesa portion and positioned on a semi-insulating layer selected from one of said semi-insulating burying layers and said semi-insulating substrate, and an interconnection portion connecting said stripe-portion to said bonding pad portion; and said second electrode is provided exclusively on the other of the sides of said stripe-mesa structure;

whereby said optical modulator has a modulation bandwidth greater than 26 GHz.

13. An optical semiconductor device according to claim 12, wherein said optical modulator has a modulation bandwidth of greater than 50 GHz.

14. An optical semiconductor device, according to claim 12, wherein:

said first cladding layer has a portion extended under one of said semi-insulating burying layers and exposed on said semi-insulating substrate; and said second electrode is positioned on said portion of said first cladding layer.

15. An optical semiconductor device, according to claim 12, wherein:

said interconnection portion crosses one of said semi-insulating burying layers to be air-spaced relative to said one of said semi-insulating burying layers.

16. An optical semiconductor device according to claim 14, wherein said means for applying an electric field applies an electric field that is perpendicular to said light absorption layer.

17. An optical semiconductor device, comprising:
a stripe-mesa structure provided on a semi-insulating substrate, said stripe-mesa structure including a first cladding layer of a first conduction type, an undoped light absorption layer, and a second cladding layer of a second conduction type;
semi-insulating burying layers for burying said stripe-mesa structure on both sides thereof; and
no more than a single signal electrode and a single ground electrode for applying an electric field to said undoped light absorption layer, said signal electrode including a first portion provided on said stripe-mesa structure and a second portion electrically connected by an interconnection portion to said first portion and provided on one of said semi-insulating burying layers exclusively on one of the sides of said stripe-mesa structure, said ground electrode provided exclusively on the other of the sides of said stripe-mesa structure, and said signal and ground electrodes being laterally offset, so as not to face one another;
whereby said optical semiconductor device has a modulation bandwidth greater than 26 GHz.

18. An optical semiconductor device according to claim 17, wherein:
said first cladding layer includes an exposed portion that is exposed on said semi-insulating substrate and extends away from said stripe-mesa structure; and
said ground electrode is provided on said exposed portion of said first cladding layer.

19. An optical semiconductor device according to claim 17, wherein said optical semiconductor device has a modulation bandwidth of greater than 50 GHz.

20. An optical semiconductor device, comprising:
a stripe-mesa structure provided on a semi-insulating substrate, said stripe-mesa structure including a first cladding layer on a first conduction type, an undoped light absorption layer, and a second cladding layer of a second conduction type;
semi-insulating burying layers for burying said strip-mesa structure on both sides thereof; and
no more than a single signal electrode and a single ground electrode for applying an electric field to said undoped light absorption layer, said signal electrode including a first portion provided on said stripe-mesa structure and a second portion electrically connected by an interconnection portion to said first portion and provided exclusively on one of the sides of said stripe-mesa structure on a portion of said semiinsulating substrate which is not covered by said stripe-mesa structure, said ground electrode provided exclusively on the other of the sides of said stripe-mesa structure, and said signal and ground electrodes being laterally offset, so as not to face one another;
whereby said optical semiconductor device has a modulation bandwidth greater than 26 GHz.

21. An optical semiconductor device according to claim 20, wherein:
said first cladding layer includes an exposed portion that is exposed on said semi-insulating substrate and extends away from said stripe-mesa structure; and
said ground electrode is provided on said exposed portion of said first cladding layer.

22. An optical semiconductor device according to claim 20, wherein said optical semiconductor device has a modulation bandwidth of greater than 50 GHz.

23. An optical semiconductor device, comprising:
a semi-insulating substrate having one face comprising a first plane and a second plane, said first plane being lower in position level than said second plane;
a buffer layer for burying said first plane of said semi-insulating substrate;
a stripe-mesa structure provided only on a first portion of said buffer layer, said stripe-mesa structure including a first cladding layer of a first conduction type, an undoped light absorption layer, and a second cladding layer of a second conduction type;
semi-insulating burying layers for burying said stripe-mesa structure on both sides thereof; and
no more than a single signal electrode and a single ground electrode for applying an electric field to said undoped light absorption layer, said signal electrode having a first portion provided on said stripe-mesa structure and a second portion provided on one of said semi-insulating burying layers exclusively on one of the sides of said stripe-mesa structure, and said ground electrode being provided only on a second portion of said buffer layer exclusively on the other of the sides of said stripe-mesa structure and not overlapping said first portion, said signal and ground electrodes being laterally off set, so as not to face one another;
whereby said optical semiconductor device has a modulation bandwidth greater than 26 GHz.

24. An optical semiconductor device according to claim 23, wherein said optical semiconductor device has a modulation bandwidth of greater than 50 GHz.

25. An optical semiconductor device, comprising:
a stripe-mesa structure provided on a semi-insulating substrate, said stripe-mesa structure including a first cladding layer of a first conduction type, an undoped light absorption layer, a second cladding layer of a second conduction type, and a cap layer of said second conduction type;
semi-insulating burying layers for burying said stripe-mesa structure on both sides thereof; and
means for applying an electric field to said undoped light absorption layer;
whereby said optical semiconductor device has a modulation bandwidth greater than 26 GHz.

26. An optical semiconductor device, according to claim 25, wherein:
said applying means includes a first electrode connected to said cap layer, and a second electrode connected to said first cladding layer exposed on said semi-insulating substrate.

27. An optical semiconductor device, according to claim 25, wherein:
said first electrode includes a stripe-portion positioned on said cap layer, a bonding pad portion positioned on one of said semi-insulating burying layers, and an interconnection portion connecting said stripe-portion to said bonding pad portion.

28. An optical semiconductor device, according to claim 26, wherein:
said first electrode includes a stripe-portion positioned on said cap layer, a bonding pad portion positioned on said semi-insulating substrate, and an interconnection portion connecting said stripe-portion to said bonding pad portion.

29. An optical semiconductor device, according to claim 28, wherein:
said interconnection portion crosses one of said semi-insulating burying layers to have air-space relative to said one of said semi-insulating burying layer.

30. An optical semiconductor device according to claim 25, wherein said optical semiconductor device has a modulation bandwidth of greater than 50 GHz.

31. An optical semiconductor device, comprising:

a stripe-mesa structure provided on a semi-insulating substrate, said stripe-mesa structure including a buffer layer formed in an exposed upper portion of said semi-insulating substrate, a first cladding layer of a first conduction type, an undoped light absorption layer, a second cladding layer of a second conduction type, and a cap layer of said second conduction type;

semi-insulating burying layers for burying said stripe-mesa structure on both sides-thereof; and means for applying an electric field to said undoped light absorption layer;

whereby said optical semiconductor device has a modulation bandwidth greater than 26 GHz.

32. An optical semiconductor device, according to claim 31, wherein:

said applying means includes a first electrode connected to said cap layer, and a second electrode connected to said buffer layer exposed on said semi-insulating substrate.

33. An optical semiconductor device according to claim 31, wherein said optical semiconductor device has a modulation bandwidth of greater than 50 GHz.

34. An optical semiconductor device, comprising:

a stripe-mesa structure provided on a semi-insulating substrate, said stripe-mesa structure including a first cladding layer of a first conduction type, an undoped light absorption layer, a second cladding layer of a second conduction type, and a cap layer of said second conduction type;

semi-insulating burying layers for burying said stripe-mesa structure on both sides thereof; and means for detecting photocurrent generated by light absorbed into said undoped light absorption layer;

whereby said optical semiconductor device has a response bandwidth greater than 26 GHz.

35. An optical semiconductor device, according to claim 34, wherein:

said undoped light absorption layer is composed of a composition having a bandgap wavelength which is longer than a wavelength of light supplied thereto.

36. An optical semiconductor device, according to claim 35, wherein:

said detecting means includes a first electrode connected to said cap layer, and a second electrode connected to said first cladding layer exposed on said semi-insulating substrate.

37. An optical semiconductor device, according to claim 36, wherein:

said first electrode includes a stripe-portion positioned on said cap layer, a bonding pad portion positioned on one of said semi-insulating burying layers, and an interconnection portion connecting said stripe-portion to said bonding pad portion.

38. An optical semiconductor device, according to claim 36, wherein:

said first electrode includes a stripe-portion positioned on said cap layer, a bonding pad portion positioned on said semi-insulating substrate, and an interconnection portion connecting said stripe-portion to said bonding pad portion.

39. An optical semiconductor device, according to claim 38, wherein:

said interconnection portion crosses one of said semi-insulating burying layers to have air-space relative to said some of said semi-insulating burying layer.

40. An optical semiconductor device according to claim 34, wherein said optical semiconductor device has a response bandwidth of greater than 50 GHz.

41. An optical semiconductor device, comprising:

a stripe-mesa structure provided on a semi-insulating substrate said stripe-mesa structure including a buffer layer formed in an exposed upper portion of said semi-insulating substrate, a first cladding layer of a first conduction type, an undoped light absorption layer, a second cladding layer of a second conduction type, and a cap layer of said second conduction type;

semi-insulating burying layers for burying said stripe-mesa structure on both sides thereof; and means for applying an electric field to said undoped light absorption layer;

whereby said optical semiconductor device has a response bandwidth greater than 26 GHz.

42. An optical semiconductor device, according to claim 41, wherein;

said applying means includes a first electrode connected to said cap layer, and a second electrode connected to said buffer layer exposed on said semi-insulating substrate.

43. An optical semiconductor device, according to claim 41, wherein:

said undoped light absorption layer is composed of a composition having a bandgap wavelength which is longer than a wavelength of light supplied thereto.

44. An optical semiconductor device according to claim 41, wherein said optical semiconductor device has a response bandwidth of greater than 50 GHz.

45. An optical semiconductor device, comprising:

an optical modulator, including:
a stripe-mesa structure provided on a semi-insulating substrate, said stripe-mesa structure including a first cladding layer of a first conduction type, an undoped light absorption layer, a second cladding layer of a second conduction type, and a cap layer of said second conduction type;
semi-insulating burying layers for burying said stripe-mesa structure on both sides thereof; and
first means for applying an electric field to said undoped light absorption layer;
whereby said optical modulator has a modulation bandwidth greater than 26 GHz; and
a semiconductor layer, including:
a stripe-mesa structure provided on a portion having a grating of said semi-insulating substrate, said stripe-mesa structure including a first cladding layer of said first condition type, an undoped active layer, a second cladding layer of said second conducting type, and a cap layer of said second conducting type, and a cap layer of said second conduction type;
semi-insulating burying layers for burying said stripe-mesa structure on both sides thereof; and
second means for applying an electric field to said active layer;
wherein said undoped light absorption layer and said undoped active layer are connected by an optical coupling, said first and second applying means include electric-separated electrodes and a common electrode, and said second cladding layers are divided by a groove having a predetermined depth.

46. An optical semiconductor device according to claim 45, wherein said optical modulator has a modulation bandwidth of greater than 50 GHz.

* * * * *